(12) United States Patent
Kobayashi

(10) Patent No.: US 7,807,510 B2
(45) Date of Patent: Oct. 5, 2010

(54) METHOD OF MANUFACTURING CHIP INTEGRATED SUBSTRATE

(75) Inventor: Toshio Kobayashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 12/123,744

(22) Filed: May 20, 2008

(65) Prior Publication Data

US 2008/0293189 A1 Nov. 27, 2008

(30) Foreign Application Priority Data

May 21, 2007 (JP) ............................... 2007-133947

(51) Int. Cl.
*H01L 23/31* (2006.01)
*H01L 21/70* (2006.01)

(52) U.S. Cl. ...................... 438/124; 438/127; 257/724; 257/790; 257/E23.126; 257/686; 257/690; 257/E21.504

(58) Field of Classification Search ................. 257/790, 257/686, 723–725, 784, E23.033, E21.504, 257/690, E23.126; 438/106–127, 455–459
See application file for complete search history.

(56) References Cited

U.S. PATENT DOCUMENTS 5,973,393 A * 10/1999 Chia et al. ................... 257/690
6,762,078 B2 * 7/2004 Shin et al. .................... 438/123
2004/0222508 A1 * 11/2004 Aoyagi ........................ 257/686
2006/0071330 A1 * 4/2006 Suminoe et al. ............. 257/723
2006/0231939 A1 * 10/2006 Kawabata et al. ........... 257/686
2007/0187810 A1 * 8/2007 Mok et al. ................... 257/686
2008/0211078 A1 * 9/2008 Kwon et al. ................. 257/686

FOREIGN PATENT DOCUMENTS

JP 2003-347722 12/2003

* cited by examiner

*Primary Examiner*—Matthew C Landau
*Assistant Examiner*—Aaron Staniszewski
(74) *Attorney, Agent, or Firm*—Drinker Biddle & Reath LLP

(57) ABSTRACT

There are provided the steps of connecting a chip component 13 to a first substrate 10 through a wire 14, providing an electrode 21 on a second substrate 20, attaching, to the first substrate 10, a molding tool 30 having a protruded portion 31 formed corresponding to an array of a bump connecting pad 12 of the first substrate 10 and a cavity 32 formed corresponding to a region in which the chip component 13 is mounted, thereby forming a first sealing resin 34 for sealing the chip component 13 and the wire 14, bonding the electrode 21 to the bump connecting pad 12 through a solder, thereby bonding the first substrate 10 to the second substrate 20, and filling a second filling resin 40 in a clearance portion between the first substrate 10 and the second substrate 20.

2 Claims, 2 Drawing Sheets

METHOD OF MANUFACTURING CHIP INTEGRATED SUBSTRATE

BACKGROUND OF THE INVENTION

The present invention relates to a method of manufacturing a chip integrated substrate and more particularly to a method of manufacturing a chip integrated substrate which manufactures a chip integrated substrate having a chip provided between a pair of wiring boards.

At present, a performance of an electronic apparatus using a semiconductor device including a semiconductor chip has been enhanced, and it has been demanded to increase a density in the case in which a semiconductor chip is mounted on a substrate and to reduce a size and a space of the substrate mounting the semiconductor chip thereon.

Therefore, there has been proposed a substrate having a semiconductor chip embedded therein, that is, a so-called chip integrated type wiring board (hereinafter referred to as a chip integrated substrate), and there have been proposed various structures for causing the semiconductor chip to include the substrate.

An example of the chip integrated substrate is disclosed in Patent Document 1, for example. The chip integrated substrate disclosed in the Patent Document 1 is provided with a bump for functioning as a spacer between a first mounting substrate and a second mounting substrate, and has a structure in which a chip is mounted between a pair of substrates which are separated from each other through a bump. Moreover, there is employed a structure in which a sealing resin is provided between a pair of mounting substrates to protect the chip.

As a method of manufacturing the chip integrated substrate disclosed in the Patent Document 1, moreover, the semiconductor chip is first flip-flop mounted on the first mounting substrate and a bump functioning as a spacer is subsequently soldered to the first mounting substrate. Next, at least a portion in the vicinity of an apex of the bump is exposed onto the first mounting substrate and a sealing resin is formed to seal the chip.

When the sealing resin is formed, the second mounting substrate is laminated thereon to be electrically connected to the bump. Each of the processings is executed to manufacture the chip integrated substrate disclosed in the Patent Document 1.

[Patent Document 1] JP-A-2003-347722

The chip integrated substrate disclosed in the Patent Document 1 uses a method of flip-chip mounting a chip on the first mounting substrate. In case of a chip having a comparatively small number of terminals, however, the use of a wire bonding method can reduce a cost and can enhance an assembling property more greatly than that of a flip-chip mounting method.

On the other hand, in the method of manufacturing the chip integrated substrate disclosed in the Patent Document 1, the bump is provided on the first mounting substrate after the chip is mounted, and a soldering treatment is carried out at that time. In this case, a solder flux is applied to a soldering position of the bump of the first mounting substrate in a normal soldering treatment to enhance a wettability, thereby improving a reliability of a soldering bond, which is not particularly described in the Patent Document 1.

In the case in which the solder flux remains as a residue after the soldering, it causes a corrosion. For this reason, a cleaning treatment is carried out. In the cleaning treatment, the flux is reliably removed. Therefore, a cleaning solution is injected into a solder bonding position at a comparatively high flow velocity.

In the chip integrated substrate, however, a reduction in a size and space saving are implemented as described above, and the chip is mounted in the vicinity of a position in which the bump is provided in some cases. In these cases, when the chip is connected to the first mounting substrate by using the wire bonding method, there is a possibility that the cleaning solution might be injected onto a wire. In this case, there is a problem in that the wire is broken or the wire is deformed, resulting in the generation of a short circuit between adjacent wires.

SUMMARY OF THE INVENTION

In consideration of the respects, it is an object of the invention to provide a method of manufacturing a chip integrated substrate which can maintain a high reliability even if a chip component is connected to a first substrate through a wire.

In order to solve the problems, according to a first aspect of the invention, there is provided a method of manufacturing a chip integrated substrate, including the steps of:

connecting a chip component to a first substrate having a connecting pad formed thereon through wire bonding; providing, on a second substrate, an electrode protruded from a surface of the substrate;

attaching, to the first substrate, a molding tool having a protruded portion formed corresponding to an array of the connecting pad and a cavity formed corresponding to a region in which the chip component is mounted, causing the protruded portion to abut on a surface of the connecting pad, and filling the cavity with a first resin to seal the chip component and a wire with a resin;

bonding the connecting pad to the electrode through a solder, and bonding the first substrate to the second substrate in such a manner that the chip component sealed with the resin is provided therein; and filling a second resin in a clearance portion between the first substrate and the second substrate.

Moreover, in the invention, the electrode may include a metal core formed of copper and a solder film coated thereon.

Furthermore, in the invention, the connecting pad may be provided in a position between sealing regions in which the adjacent chip components are sealed with a resin.

According to the invention, the chip component connected to the first substrate through the wire and the wire are sealed with the first resin by using the molding tool before the connecting pad and the electrode are bonded to each other through the solder. Even if flux cleaning is carried out after the connecting pad and the electrode are bonded to each other through the solder, therefore, it is possible to prevent a breakage or a short circuit of the wire from being generated in the flux cleaning. Accordingly, it is possible to enhance a reliability of the chip integrated substrate.

DETAILED DESCRIPTION OF THE PREFERRED EMBODIMENTS

Figure 1A:
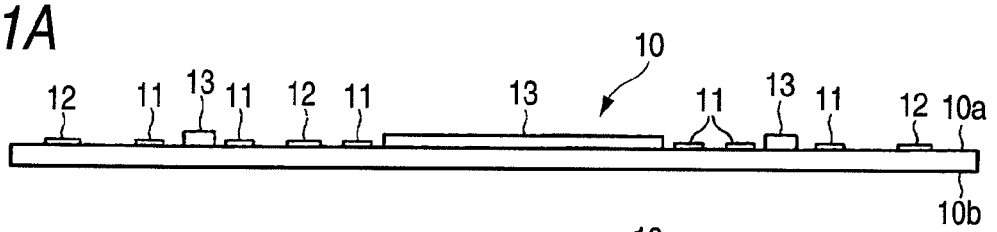
FIGS. 1A to 1F are views for explaining a method of manufacturing a chip integrated substrate according to a first example of the invention in accordance with a manufacturing procedure (No. 1)

Next, the best mode for carrying out the invention will be described with reference to the drawings.

FIGS. 1 and 2 are views for explaining a method of manufacturing a chip integrated substrate according to an example of the invention in accordance with a manufacturing procedure. In particular, FIG. 2B shows a chip integrated substrate 1 which is manufactured by the manufacturing method according to the example, and a structure of the chip integrated substrate 13 will be described with reference to FIG. 2B prior to explanation of the method of manufacturing a chip integrated substrate for convenience of the description.

The chip integrated substrate 1 is roughly constituted by a first substrate 10, a second substrate 20, a chip-shaped electronic component 13 (which will be hereinafter referred to as a chip component), an electrode 21, a first sealing resin 34 and a second sealing resin 40. The first substrate 10 is a wiring board on which a wiring pattern is formed, and has a plurality of chip components 13 mounted on an upper surface 10a. In the example, the chip component 13 is connected to a wire connecting pad 11 formed on the first substrate 10 through a wire 14 used for wire bonding, for example, an Au wire.

Moreover, the second substrate 20 is also a wiring board on which a wiring pattern is formed, and has the electrode 21 connected to the wiring pattern. The electrode 21 is bonded to a bump connecting pad 12 formed on the first substrate 10 through a solder. The electrode 21 functions as a spacer for electrically connecting the first substrate 10 to the second substrate 20 and separating the first substrate 10 from the second substrate 20 by a predetermined distance. Moreover, a height of the electrode 21 is set to be slightly greater than that of a wire loop of each wire 14.

The first sealing resin 34 is formed on the first substrate 10 to seal the chip component 13 and the wire 14. The chip component 13 and the wire 14 are protected by the first sealing resin 34.

Moreover, the second sealing resin 40 is filled between the first substrate 10 and the second substrate 20. The second sealing resin 40 functions as an adhesive. Accordingly, the first substrate 10 and the second substrate 20 are firmly bonded to each other with the second sealing resin 40.

According to the chip integrated substrate 1 having the structure, the chip component 13 is provided between a pair of substrates 10 and 20. Moreover, a clearance between the first substrate 10 and the second substrate 20 can be set to be a distance at which the second substrate 20 is prevented from coming in contact with the wire 14 through the electrode 21 with high precision. Therefore, it is possible to reduce a size of the chip integrated substrate 1.

As described above, furthermore, the first substrate 10 and the second substrate 20 are bonded by two bonding forces including a bonding force applied from the electrode 21 and a bonding force (an adhesion force) applied from the second sealing resin 40. Therefore, they are bonded to each other with a high reliability.

Subsequently, description will be given to a method of manufacturing the chip integrated substrate 1 having the structure.

In order to manufacture the chip integrated substrate 1, first of all, the first substrate 10 is prepared. The first substrate 10 has a multilayer wiring structure in which a through hole, a bottomed via plug, a wiring pattern and a solder resist (which are not shown) are provided on an ordinary printed circuit board or a core substrate formed by a prepreg material (a material obtained by impregnating a glass fiber with an epoxy resin), for example. The wire connecting pad 11 and the bump connecting pad 12 which are connected to the wiring patterns are formed on the upper surface 10a of the first substrate 10.

The chip component 13 is mounted on the upper surface 10a of the first substrate 10 having the structure by using an adhesive for dicing. FIG. 1A shows a state in which the chip component 13 is mounted on the first substrate 10. The chip component 13 is a semiconductor chip, for instance, and is mounted in face-up in the example.

The chip component 13 mounted on the first substrate 10 is not restricted to the semiconductor chip but may be another electronic component (for example, a capacitor, a resistor or an inductor).

Moreover, the wire connecting pad 11 and the bump connecting pad 12 actually have such a structure as to be exposed from an opening portion formed on a solder resist disposed on the first substrate 10. In FIGS. 1 and 2, they are shown to be protruded (exposed) from the upper surface 10a for easy understanding.

When the chip component 13 is mounted on the first substrate 10 as described above, a step of electrically connecting the chip component 13 to the first substrate 10 is subsequently carried out. As described above, in the example, the chip component 13 is mounted on the first substrate 10 in face-up, and the chip component 13 and the wire connecting pad 11 are connected by using a wire bonding method.

Figure 1B:
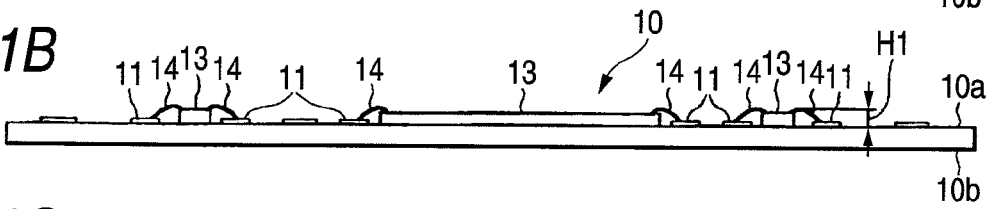

More specifically, the first substrate 10 is attached to a wire bonding device, and the wire 14 is provided between the electrode formed on the chip component 13 and the wire connecting pad 11. FIG. 1B shows a state in which the wire 14 is provided between the chip component 13 and the wire connecting pad 11.

Figure 1C:
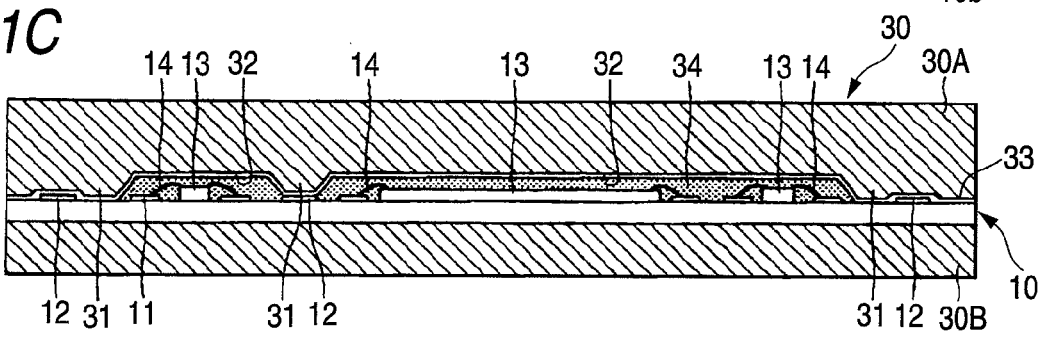

When the chip component 13 and the first substrate 10 are connected to each other through the wire 14, the first substrate 10 is attached to a molding tool (mold/die) 30. FIG. 1C shows a state in which the first substrate 10 is attached to the molding tool 30.

The molding tool 30 is constituted by an upper mold 30A and a lower mold 30B. In the molding tool 30, moreover, a cavity 32 is formed in an opposed position of the chip component 13 and the wire 14 (the region is set to be a region on which the chip component is mounted) in the upper mold 30A.

Moreover, the molding tool 30 is provided with a protruded portion 31 which is protruded toward the first substrate 10 in a portion in which the bump connecting pad 12 is formed between the adjacent chip components 13. Furthermore, a mold releasing sheet 33 is provided between the first substrate 10 and the upper mold 30A to enhance a mold releasing property after molding.

When the first substrate 10 is attached to the molding tool 30 having the structure, a resin is subsequently filled into the cavity 32 through a resin implanting apparatus (not shown) at a predetermined pressure. Consequently, the first sealing resin 34 for sealing the chip component 13 and the wire 14 is formed on the upper surface 10a of the first substrate 10.

When the resin is filled, the protruded portion 31 of the upper mold 30A abuts on an upper part (a surface) of the bump connecting pad 12 through the mold releasing sheet 33 and is thus pressure welded. Therefore, the first sealing resin 34 can be prevented from sticking to the bump connecting pad 12.

Figure 1D:
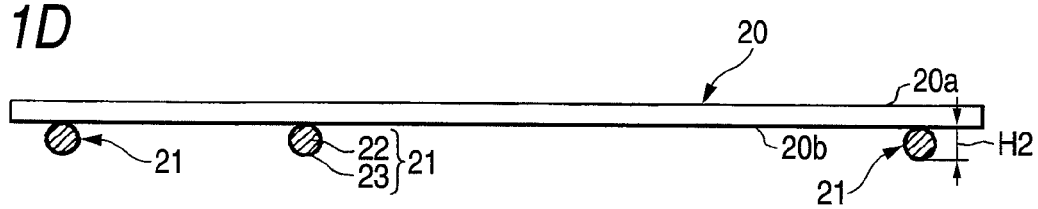
Figure 1E:
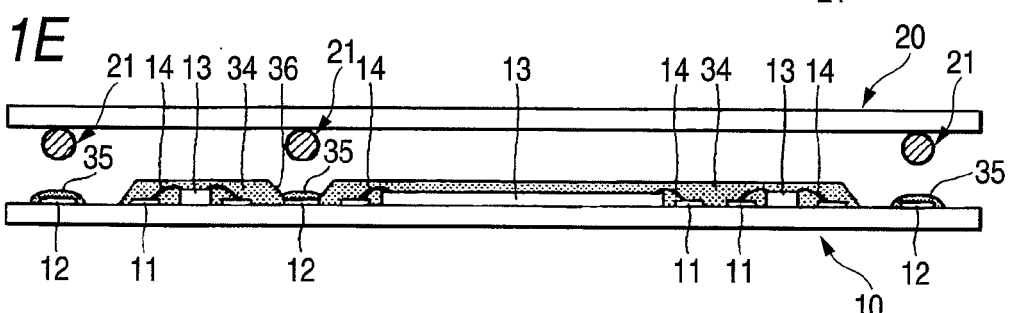

Moreover, a trench portion 36 is formed between the adjacent first sealing resins 34 in a portion in which the bump connecting pad 12 is formed between the adjacent chip components 13 over the first substrate 10, and the bump connecting pad 12 is present in a bottom portion thereof (see FIG. 1E).

FIG. 1D shows the second substrate 20. The second substrate 20 has the same structure as the first substrate 10. More specifically, the second substrate 20 has a multilayer wiring structure in which a through hole, a bottomed via plug, a wiring pattern and a solder resist (which are not shown) are provided on an ordinary printed circuit board or a core substrate formed by a prepreg material, for example. A lower surface 20b of the second substrate 20 is set in a state in which an electrode connecting pad (not shown) connected to a wiring pattern is exposed from an opening formed on a solder resist.

The electrode 21 is bonded to the electrode connecting pad of the second substrate 20 having the structure. FIG. 1D shows a state in which the electrode 21 is bonded to the second substrate 20.

The electrode 21 has such structure that a solder coat 23 is formed (covered) on a metal core 22. In the example, a ball formed of copper is used for the metal core 22 (the metal core 22 will be hereinafter referred to as a copper core 22).

In order to bond the electrode 21 to the second substrate 20, first of all, a solder flux is applied to the electrode connecting pad of the second substrate 20 and the electrode 21 is soldered to the electrode connecting pad. After the electrode 21 is bonded to the second substrate 20, moreover, a step of cleaning the flux is carried out. Since the flux cleaning is carried out in a state in which the second substrate 20 has not been bonded to the first substrate 10, the first substrate 10 is not influenced.

Moreover, an amount of protrusion of the electrode 21 from the lower surface 20b of the second substrate 20 (which is shown in an arrow H2 of FIG. 1D) is set to be greater than a height of the wire loop of the wire 14 for electrically connecting the chip component 13 to the wire connecting pad 11 (which is shown in an arrow H1 of FIG. 1B) (H2>H1).

Figure 1F:
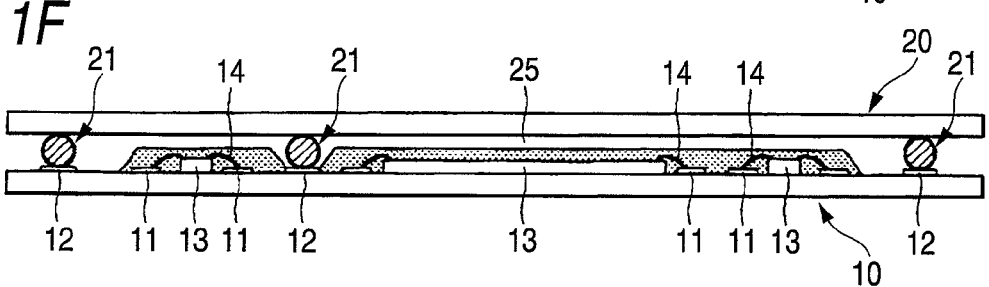

It is possible to earlier execute either the step of mounting the chip component 13 on the first substrate 10, providing the wire 14, and forming the first sealing resin 34 as described with reference to FIGS. 1A, 1B and 1C or the step of bonding the electrode 21 to the second substrate 20 as described with reference to FIGS. 1D, 1E and 1F or to execute both of them at the same time.

When the respective manufacturing steps for the first substrate 10 and the second substrate 20 are ended, a step of bonding the first substrate 10 to the second substrate 20 is subsequently carried out.

In order to bond the first substrate 10 to the second substrate 20, first of all, a solder flux 35 is provided on the bump connecting pad 12 formed on the first substrate 10. In this case, the solder flux 35 is provided in the trench portion 36 in a portion in which the trench portion 36 is formed between the adjacent first sealing resins 34.

When the solder flux 35 is provided on the bump connecting pad 12, the first substrate 10 and the second substrate 20 are subsequently positioned in such a manner that the electrode 21 and the bump connecting pad 12 are opposed to each other. FIG. 1E shows a state in which the second substrate 20 is positioned above the first substrate 10.

Next, the first substrate 10 and the second substrate 20 are pressure welded, and are subsequently put in a reflow furnace and are thus heated to solder the electrode 21 to the bump connecting pad 12, for example. Consequently, the electrode 21 and the bump connecting pad 12 are bonded to each other, and are electrically connected to each other and mechanically fixed.

In the example, particularly, the bump connecting pad 12 is formed in the trench portion 36. Consequently, any of the bump connecting pads 12 does not need to be disposed in a position of an outer periphery of the first substrate 10. This will be described below.

More specifically, assuming that the trench portion 36 from which the bump connecting pad 12 is exposed is not formed but the first sealing resin 34 is formed over the whole inside of the first substrate 10, it is necessary to inevitably dispose the bump connecting pad 12 on an outside of a region in which the first sealing resin 34 is formed (that is, the position of the outer periphery of the first substrate 10) in the structure. With the structure, however, a wiring from the wire connecting pad 11 to the bump connecting pad 12 in the first substrate 10 is prolonged so that an impedance is increased.

On the other hand, the trench portion 36 from which the bump connecting pad 12 is exposed is formed between the first sealing resins 34 which are adjacent to each other as in the example. Consequently, it is possible to shorten the wiring from the wire connecting pad 11 to the bump connecting pad 12. Consequently, the wiring impedance can be reduced.

Description will be returned to the method of manufacturing the chip integrated substrate 1. When the electrode 21 and the bump connecting pad 12 are soldered to each other as described above, the step of cleaning the residual solder flux 35 is carried out after the soldering. In the example, the chip component 13 and the wire 14 are sealed with the first sealing resin 34 before the electrode 21 and the bump connecting pad 12 are soldered. Even if the flux cleaning is carried out after the bump connecting pad 12 and the electrode 21 are bonded to each other through the solder, therefore, it is possible to prevent the breakage or short circuit of the wire 14 from being generated in the flux cleaning. Accordingly, it is possible to enhance the reliability of the chip integrated substrate 1.

As described above, the height H2 of the electrode 21 from the lower surface 20b is set to be greater than the height H1 of the wire loop of the wire 14 from the upper surface 10a (H2>H1). When the first substrate 10 and the second substrate 20 are bonded to each other, therefore, the wire 14 can be prevented from being short-circuited due to a contact with the second substrate 20.

Figure 2A:
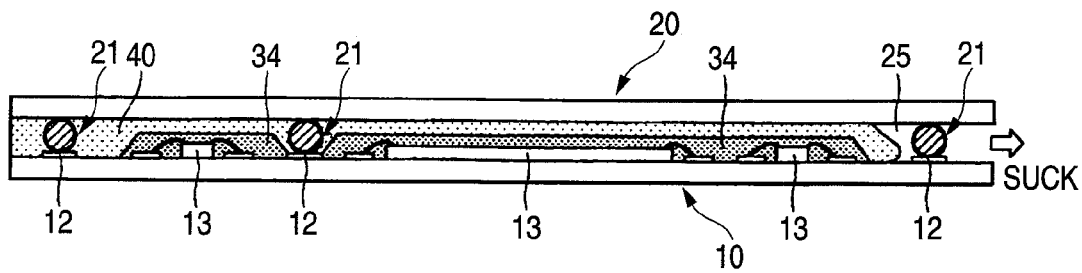
FIGS. 2A to 2D are views for explaining the method of manufacturing a chip integrated substrate according to the first example of the invention in accordance with the manufacturing procedure (No. 2).

When the first substrate 10 and the second substrate 20 are bonded to each other as described above, a step of filling the second sealing resin 40 in a clearance portion (hereinafter referred to as a space portion 25) between the first substrate 10 and the second substrate 20 is carried out as shown in FIG. 2A. In this case, it is desirable that materials having an equal coefficient of thermal expansion should be selected for the first sealing resin 34 and the second sealing resin 40 in respect of a suppression of a generation of a thermal stress.

At the step of filling the second sealing resin 40, a sucking treatment is carried out from one of sides of the space portion 25 (a right end in FIG. 2A in the example), and at the same time, the second sealing resin 40 is filled from the other side. By filling the second sealing resin 40 while carrying out the sucking treatment, thus, it is possible to reliably fill the second sealing resin 40 in the space portion 25 even if the space portion 25 is narrow. At the filling step, moreover, the wire 14 is sealed with the first sealing resin 34 as described above. Therefore, the wire 14 can be prevented from being deformed by filling the sealing resin 40.

Figure 2B:
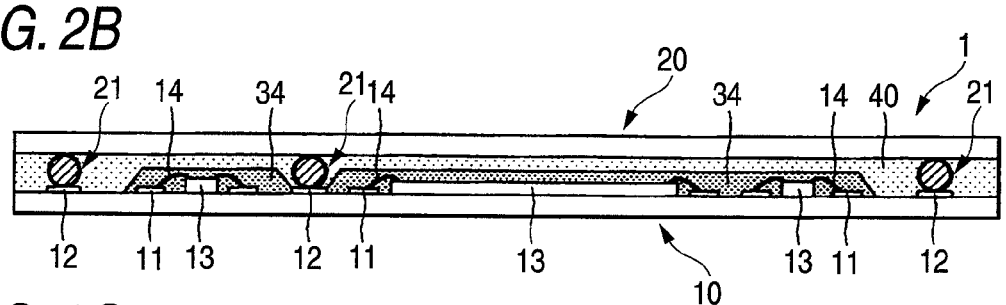
Figure 2C:
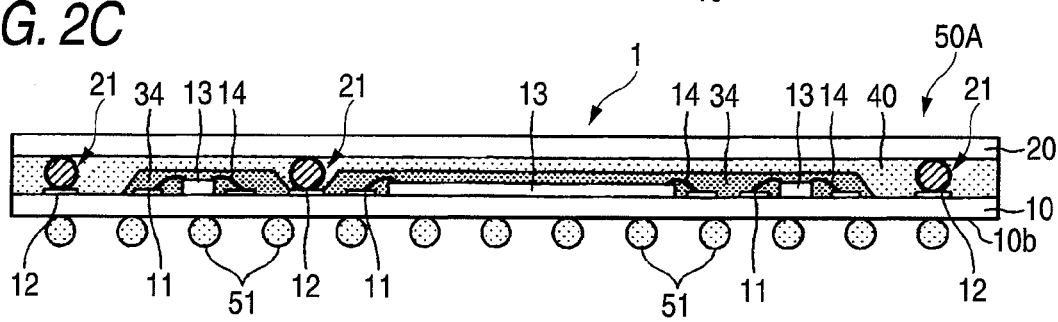
Figure 2D:
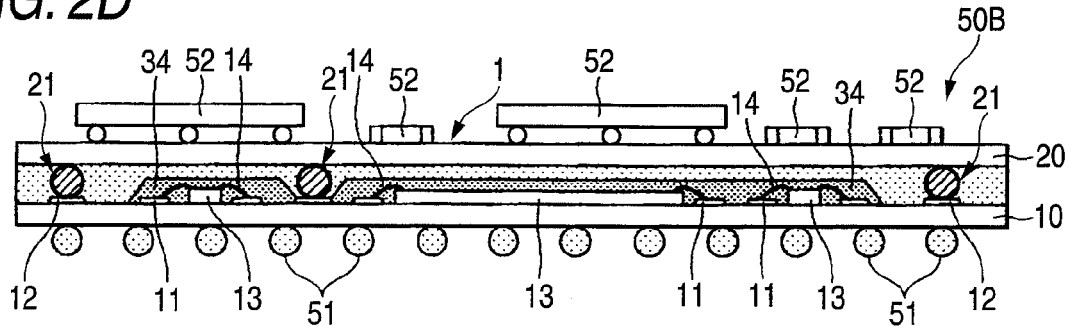

When the second sealing resin 40 is filled in the space portion 25 between the first substrate 10 and the second substrate 20, a step of curing the second sealing resin 40 (for example, a heat treatment) is subsequently carried out and the respective steps described above are executed so that the chip integrated substrate 1 shown in FIG. 2B is manufactured.

In the chip integrated substrate 1 manufactured as described above, the chip component 13 is mounted on the inner part. With a structure in which a solder ball 51 functioning as an external connecting terminal is disposed on a lower surface 10b of the first substrate 10, therefore, it is possible to use the chip integrated substrate 1 as an electronic device 50A shown in FIG. 2C. With the structure shown in FIG. 2C, furthermore, an electronic component 52 is mounted on an upper surface 20a of the second substrate 20 so that an electronic device 50B having a higher density can be implemented.

Although the preferred examples according to the invention are described above in detail, the invention is not restricted to the specific embodiment but various modifications and changes can be made without departing from the scope of the invention described in the claims.

What is claimed is:

1. A method of manufacturing a chip integrated substrate comprising the steps of:
   connecting a plurality of chip components to a first substrate through wire bonding with a wire, a top surface of the first substrate having a first connecting pad and a second connecting pad formed thereon;
   providing, on a second substrate, an electrode protruded from a surface of the second substrate, the electrode including a metal core and a solder coat covering the metal core;
   attaching, to the first substrate, a molding tool having a protruded portion formed corresponding to the first connecting pad and a cavity formed corresponding to a region in which a chip component is mounted, causing the protruded portion to abut on a surface of the first connecting pad;
   filling the cavity with a first resin to seal the chip component and the wire with the first resin, wherein the first connecting pad is provided between sealing regions in which adjacent chip components are sealed with the first resin, and the first substrate is sealed with the first resin around a periphery of the first connecting pad while forming a trench portion that is surrounded by the first resin so that between the sealing regions only the first connecting pad is exposed at a bottom portion of the trench portion, the second connecting pad being separated from the first resin;
   bonding the first connecting pad to the electrode by melting the solder coat of the electrode, and bonding the first substrate to the second substrate in such a manner that the chip component sealed with the first resin is provided in a space secured by the metal core of the electrode between the first substrate and the second substrate, the space having an open side portion; and
   after bonding the first connecting pad to the electrode by melting the solder coat of the electrode, filling a second resin in the space secured by the metal core of the electrode from the open side portion,
   wherein a height of the electrode is greater than a height of a wire loop of the wire.

2. The method of manufacturing a chip integrated substrate according to claim 1, wherein the metal core is formed of copper.

* * * * *